United States Patent [19]
Risch

[11] Patent Number: 5,586,194
[45] Date of Patent: Dec. 17, 1996

[54] AUGMENTATION AMPLIFIER

[75] Inventor: Jon M. Risch, Toomsuba, Miss.

[73] Assignee: Peavey Electronics Corporation, Meridian, Miss.

[21] Appl. No.: 220,356

[22] Filed: Mar. 31, 1994

[51] Int. Cl.$^6$ .................................................. H03F 21/00
[52] U.S. Cl. .................................................. 381/120
[58] Field of Search ........................... 381/28, 120, 111, 381/116, 117, 123; 330/146, 124 R

[56]       References Cited

U.S. PATENT DOCUMENTS

| 4,143,245 | 3/1979 | Scholz | 381/118 |
| 4,873,722 | 10/1989 | Tominari | 381/17 |
| 5,402,497 | 3/1995 | Nishimoto et al. | 381/95 |

FOREIGN PATENT DOCUMENTS

| 0108408 | 6/1984 | Japan | 330/146 |
| 1241417 | 6/1986 | U.S.S.R. | 330/146 |

Primary Examiner—Curtis Kuntz
Assistant Examiner—Ping W. Lee
Attorney, Agent, or Firm—Watson Cole Stevens Davis, P.L.L.C.

[57]        ABSTRACT

An augmentation amplifier includes a first power amplifier stage having an output adapted to be coupled to one side of a load. A second amplifier of negative unity gain has an output coupled to the input adapted to be of the first amplifier and its input coupled to the other side of the load. The circuit may be switched to bypass the bridge and modular units may be employed together. The system is particularly adapted for a powered speaker system for use with a computer sound card.

20 Claims, 5 Drawing Sheets

AUGMENTATION AMPLIFIER

BACKGROUND OF THE INVENTION

The invention relates to power amplifiers, and particularly to audio amplifiers adapted to be coupled in bridged mode to a speaker load and driven by a separate source amplifier.

Bridging stereo or two channel amplifiers is known. See, for example, FIG. 1 which illustrates a known bridged amplifier 10 comprising a first amplifier 12 having an input and an output and a second amplifier 14 likewise having an input and an output. The amplifiers 12 and 14 are identical and are coupled across opposite terminals or sides of a load such as a loud speaker 16. The input of amplifier 12 is coupled to the input of the amplifier 14 through a negative unity gain amplifier 18. Bridging an amplifier thus consists of sending an inverted input signal (commonly referred to as reverse phase or more correctly reverse polarity) to one channel, and connecting the speaker load to the active terminals of each amplifier. The speaker sees an alternating current (AC) signal that swings positive in one terminal (amplifier channel 12) and swings negative on the other terminal (amplifier channel 14) instead of the more typical connection of one speaker terminal connected to ground and the other to an active signal source.

The advantage that bridging a two channel amplifier offers is increased power output, theoretically quadruple the power output or 6 dB over normal mode of stereo or independent two channel output. This occurs without increasing the power supply rails, a common limitation due to limited output device voltage and current at voltage ratings.

In applications where the power supply voltage is limited, bridging multiple amplifiers is an effective way to generate more power than can ordinarily be derived. For example, car stereos, and particularly add-on car stereo amplifiers use amplifier bridging to great advantage. However, car stereos often employ auxiliary power supplies to achieve the required power levels.

Typically, the conventional approach to bridging two identical power amplifiers involves providing the extra circuitry inside the two channel amplifier, and utilizing a switch to change from independent two channel mode to bridged mode. Then, instead of the speaker load being coupled across the active signal output terminal of each channel and ground, the load is connected across the two active signal output terminals, with no connection of the speaker to ground. A stereo amplifier is essentially reduced to a single channel output when bridged. Therefore, if two channels are required for the final application, two more channels, or another stereo amplifier, must be added to have two bridged channels of increased power.

When an amplifier is connected in bridge mode, each channel sees the reverse polarity output of the other channel through the speaker or load. Reverse polarity loading draws more current from each channel, which is where the extra power is derived. As noted above, an increase of 6 dB is possible, which is a quadrupling of the power output. This 6 dB increase incidentally is achieved only if the load impedance stays the same as it was for the nominal two channel operation. Thus, if an amplifier is capable of driving a four ohm load when connected in independent two channel mode, the same amplifier can only handle an 8 ohm load when used in the bridge mode. Accordingly, the effective increase in the power output is about 3 dB, which is a doubling of the output power. In essence, bridging the amplifiers has the result of adding together the output power of each amplifier.

Normally two different amplifiers, i.e., amplifiers in separate chassis or enclosures, may not be added together to sum their power. Typically, if the output of one power amplifier is coupled to the input of another power amplifier, the input from the first amplifier is treated as a voltage signal and the power of the first amplifier is not added to the power of the second amplifier. It is only the power of the second amplifier that is available to the speaker load. See, for example, the system 20 in FIG. 2 in which a source amplifier 22, which may be on the sound card 23 of a computer 25, has its output coupled to the input of a second amplifier 24 which is in turn coupled to a speaker 26. If bridging of the two amplifiers 22 and 24 were attempted, unless the two amplifiers are closely matched in power output capability, there would exist the possibility of damage to the lesser powered amplifier. For example, if a 2 watt amplifier is bridged to a 35 watt amplifier, the more powerful amplifier will overpower the smaller one. Not only would the smaller amplifier run out of power or clip the signal before the high power amplifier, but the resulting distortion of the signal would cause the larger amplifier to sound as if it were distorted as well. Thus, any benefit from the bridging would be limited to the power level of the smaller amplifier. This would severely limit the usefulness of connecting amplifiers in bridged mode.

Some situations are more well defined. For example, car stereos and computer sound cards both have a relatively well defined power supply voltage of about 12 VDC. This defines and thus limits how much power can be derived by a power amplifier supplied from such voltage (approximately 4 watts clean and about 5 watts at 10% distortion) without bridging or some sort of voltage step-up power supply, both of which are more costly and complex.

In the case of computer sound cards, the standard one-eighth inch stereo output jack is ground referenced and both channels have a common ground. This effectively prevents using a bridged power amplifier output approach for the sound card, because a bridged mode for stereo channels requires that both channel outputs not be grounded at either output terminal, and they may not be connected together. Computer sound cards must therefore operate with either directly derived power amplifier supply voltage, which is internally limited to about 12 volts DC, or a voltage step-up type power supply. Voltage step-up type power supplies draw excessive current which can adversely affect the 12 volt power supply of the computer. Also, due to inefficiency in voltage step-up conversion, attempting to step-up the +5 VDC power rail used to power the digital logic circuits in the computer and in memory is not a practical or cost effective expedient.

In a powered speaker application, it is common to electrically equalize the output of the amplifier to compensate for and adjust the frequency response of the speaker in the enclosure. In the normal application of bridged amplifiers, it is not typical to apply equalization to one or the other of the amplifier channels directly. Equalization is normally applied earlier in the signal chain. However, it is not always possible to apply equalization prior to the sound card amplifier. Often, the external amplifier takes the signal after it has gone through the sound card amplifier. Some systems such as the so-called Creative Labs Sound Blaster series as well as the Media Vision series of cards provide for tone controls in the software provided with the cards. For example, the Windows application has such capability. However, some users may not employ Windows, or may have a sound card that does not provide such tonal control capability. Therefore, it is not assured that such capability is always available. Further, it is not always preferable to have the end user set the tone controls to achieve an intended flat response.

It is desirable to be able to increase the power available to drive a load from a source of limited supply, for example, a computer sound card. It is desirable to employ such a limited power device to drive a powered speaker system which is separate and distinct from the computer or other source device so as to achieve a desirable sound level. It is also desirable to provide equalization to multimedia speakers, Special selectable and modular units are also desirable.

SUMMARY OF THE INVENTION

The present invention is based upon the discovery that an augmentation power amplifier may be driven in bridge mode by a separate source amplifier. The augmentation amplifier includes a first ground referenced unity gain power amplifier stage with a power capability matched (i.e., current delivery capability) to the source amplifier. The output of the first stage is adapted to be coupled to one side of a two sided load, for example, a speaker. A second negative unity gain amplifier stage having an output is coupled to the input of the first amplifier stage and its input is coupled to the other side of the load. The augmentation amplifier system is capable of delivering twice the power of the source amplifier alone when the load is matched to twice the rated load of the source amplifier for maximum allowable power transfer as determined by the source.

In a particular embodiment, the invention is directed to a powered speaker system comprising an amplifier and a speaker having a two sided input. The speaker has a load impedance matched with the amplifier for facilitating maximum allowable power transfer therebetween. The amplifier comprises a first amplifier stage. The output of the first amplifier stage is coupled to one side of the speaker and a second amplifier stage of negative unity gain has its output coupled to the input of the first amplifier and its input is coupled to the other side of the speaker.

In one application, the powered speaker is adapted to be driven by a sound card amplifier from a computer acting as a source. In another application, the amplifier may be separate from the source and the load forming a modular bridge stage.

DESCRIPTION OF THE INVENTION

Figure 3:
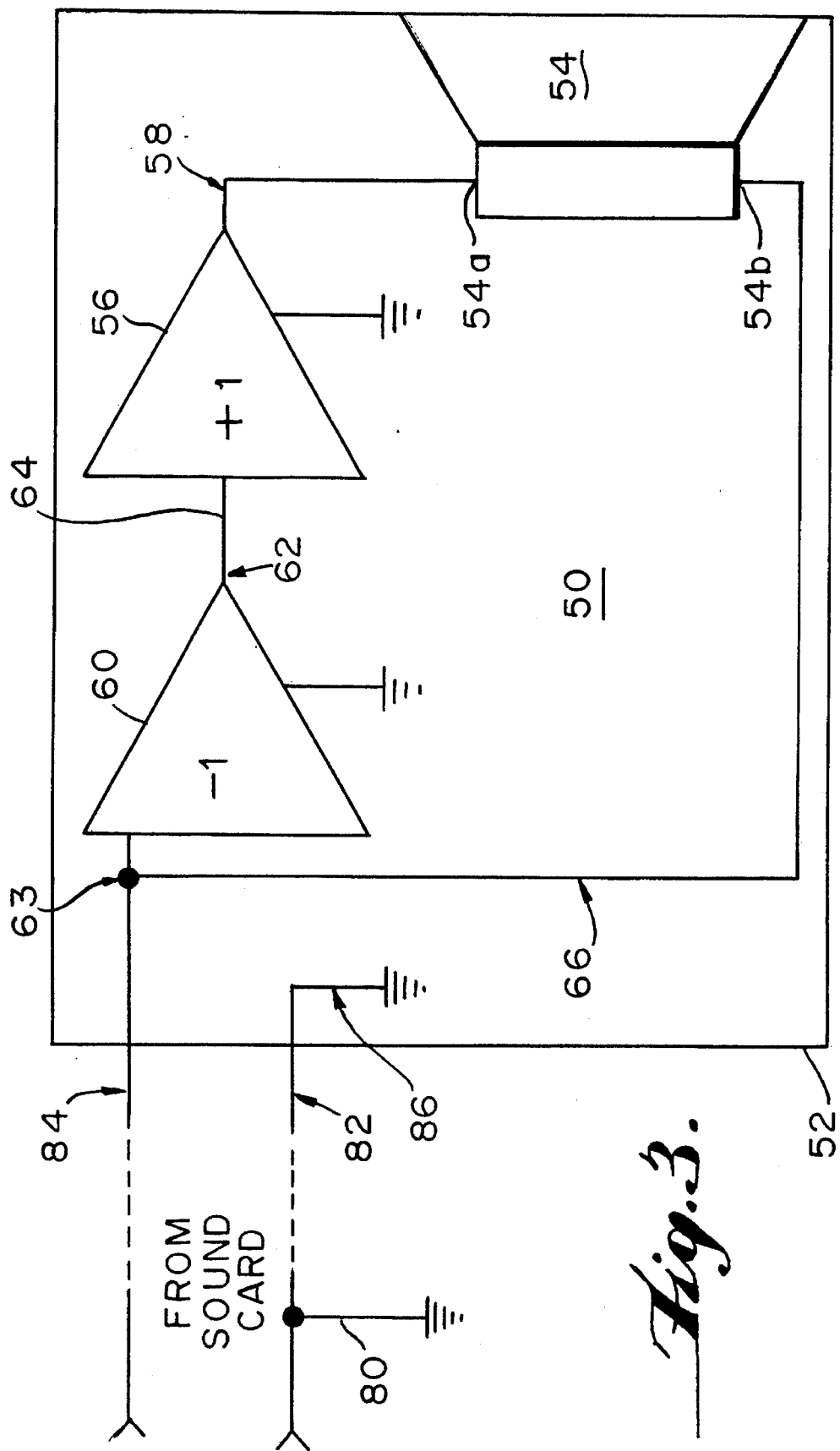
FIG. 3 is a schematic block diagram of a powered speaker system employing an augmentation amplifier according to the invention adapted to be operated in bridge mode for driving the speaker.

FIG. 3 illustrates an exemplary embodiment of a powered speaker system 50 employing an augmentation amplifier according to the present invention. The speaker system 50 includes an enclosure 52, a speaker 54 and an augmentation amplifier circuit comprising a unity gain power amplifier stage 56 having an input 64 and an output 58. The output 58 is coupled to one side 54A of the speaker 54, as illustrated. The speaker system 50 employs a unity gain inverting amplifier stage 60 having an input 63 and an output 62. The amplifier 60 may be a low power device employed simply for inverting the input signal. The output 62 of the amplifier stage 60 is coupled to the noninverting input 64 of the power amplifier stage 56. The amplifier stage 60 has its input 63 coupled to the other side 54B of the speaker 54, as illustrated.

Figure 1:
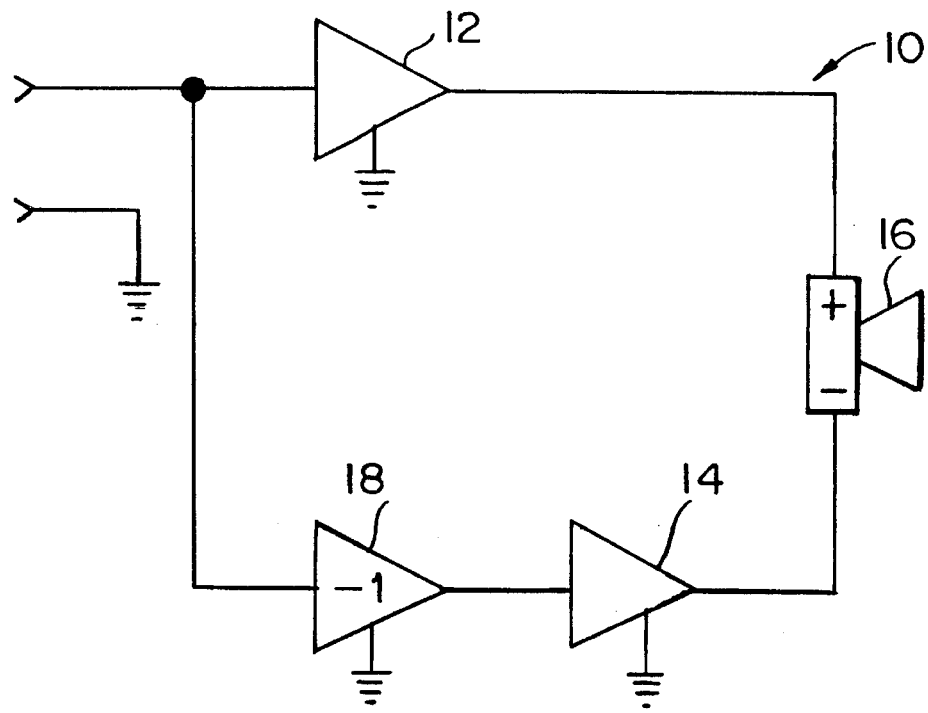
FIG. 1 is a schematic diagram of a known bridged amplifier arrangement.
Figure 2:
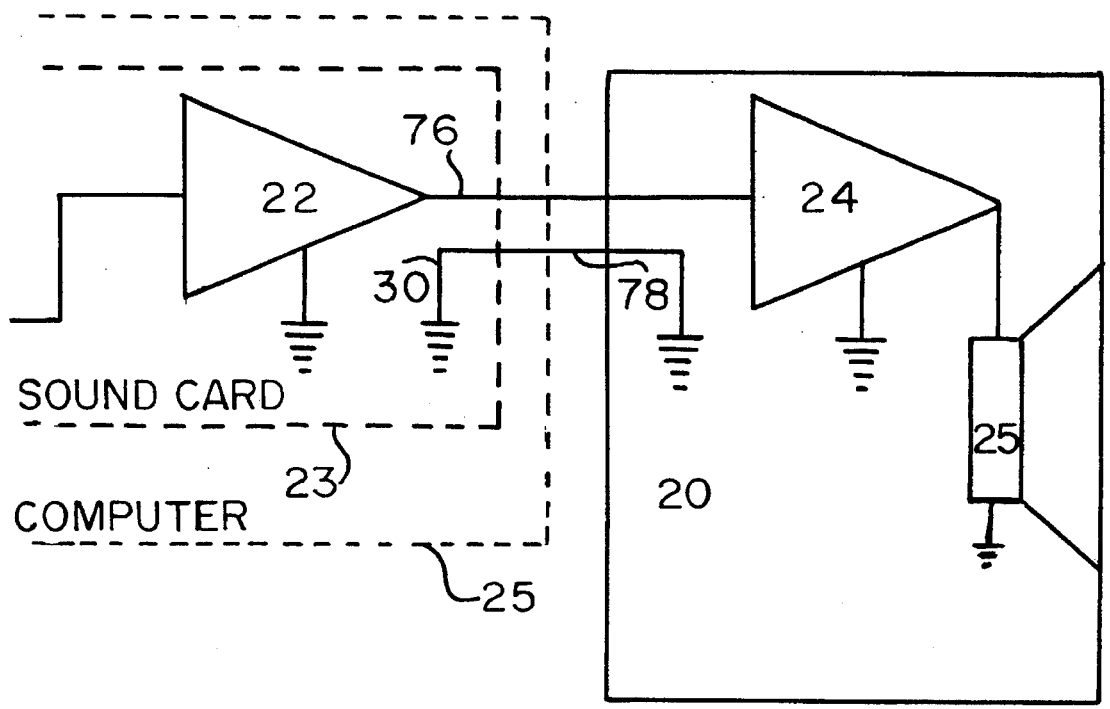
FIG. 2 is a schematic diagram of typical multimedia speaker coupled to the output of a computer sound card.

The speaker system 50, according to the invention is adapted to be coupled to a source amplifier, for example, the amplifier 22 on the sound card 23 which is part of the computer system shown in FIG. 2. Most computer sound cards have a built-in power amplifier, such as amplifier 22, and virtually all of such amplifiers are rated for 4 watts into a 4 ohm load. Thus, the source amplifier 22 has a defined and consistent output power available. The amplifier invention is tailored to match the source amplifier 22 on the sound card 23. This allows the speaker system 50 to be safely bridged to the sound card output.

In accordance with the invention, by bridging the two amplifiers, namely the source amplifier 22 (FIG. 2) and the power amplifier 56 theoretically up to about 6 dB, more power can be delivered to the speaker 54 than either amplifier could supply by itself. However, the bridge mode effectively reduces the effective load by one-half, or 2 ohms. Thus, as a practical matter, because the source amplifier 22 is not rated for operation at 2 ohms, the bridge speaker load should not be less than 8 ohms so as not to present the source amplifier 22 with less than equivalent of a 4 ohm load. In effect, this means that the net increase in allowable power is about 3 dB. This, however, is a doubling of the power available to the speaker 54. With the small and relatively inefficient speakers used in multimedia systems, for example, this limited power increase is significant.

The speaker system 50 is useful in a variety of applications, for example, car stereos and the like. However, particularly useful implementation of the invention is in connection with multimedia speakers used with computers. The invention allows a 4 watt into 4 ohms amplifier inside of a multimedia speaker system 50 to augment or add to the 4 watt 4 ohm power output of a typical computer sound card and thereby supply a total of 8 watts into a 8 ohm speaker load bridged across the amplifier within the speaker enclosure 52.

It is desirable to operate the source amplifier 22 without modification. Thus, in accordance with conventional practice, the output 76 of the source amplifier 22 is referenced at ground and typically include a hot or signal line 78 and a ground connection 80 (shown as fragmentary leads in FIG. 3). In accordance with the invention, the input 82 of the speaker system 50 has a hot or signal line 84 and a ground connection 86, and the augmentation amplifier 56 is ground referenced. The output 78 of the source amplifier 22 is commonly coupled to the input 63 of the inverting amplifier 60 and directly to one side 54B of the speaker 54. The inverting amplifier 60 changes the polarity of the sound card output and applies it to the non-inverting input 64 of the matched unity gain power amplifier stage 56 which applies the amplified output 58 the other side 54A of the speaker 54. Thus, the power or current capability of the source amplifier 22 and the power or current capability of the system amplifier 56 are added together thereby doubling the power available to the speaker 54.

In an augmentation amplifier system, if the input signal to the amplifier is reduced to zero, the output across the speaker load is reduced by about 6 dB. In order to achieve almost 6 dB of equalization, only about a 10–12 dB reduction of input signal to the augmentation amplifier is required. For instance, by reducing the signal level by approximately 10 dB relative to some nominal level over a band of frequencies, an effective method of equalizing the frequency response of an augmentation amplifier system is achieved. For example, if it is desired to boost the low frequencies delivered to a small multimedia speaker, a typical equalizing requirement, the augmentation amplifier with equalization would allow the low frequencies at full or zero dB level. At the middle-bass frequencies, for example, around 200 Hz, the signal level to the augmentation amplifier may be reduced. At some higher frequency for example, 1 kHz, response may level off at about −10 dB and carried out at this level to about 20 kHz. This will result in approximately +5 dB boost in the lower frequencies relative to the higher frequencies. This is thus an inexpensive method to provide almost 6 dB of equalization.

Figure 4:
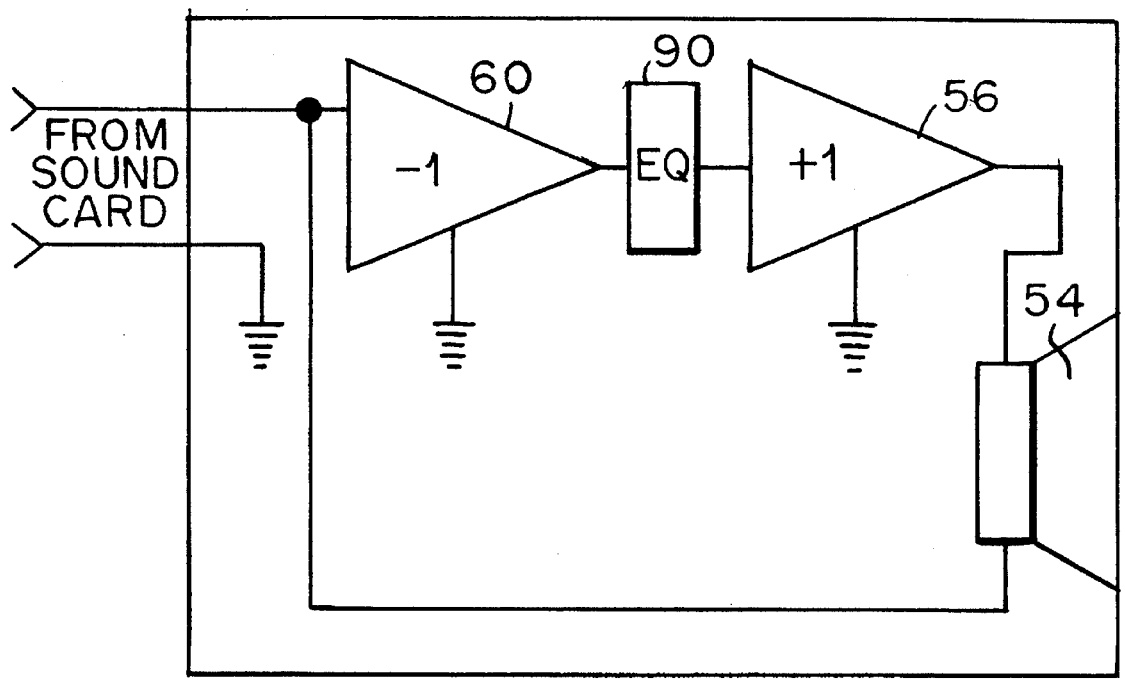
FIG. 4 is a schematic illustration of an augmentation amplifier according to the invention employing an equalization circuit.

In accordance with the present invention, FIG. 4 illustrates an equalization control 90 disposed between the unity gain amplifier stage 60 and the power amplifier stage 56. The arrangement is effective to accommodate up to about 6 dB of overall equalization.

Figure 4A:
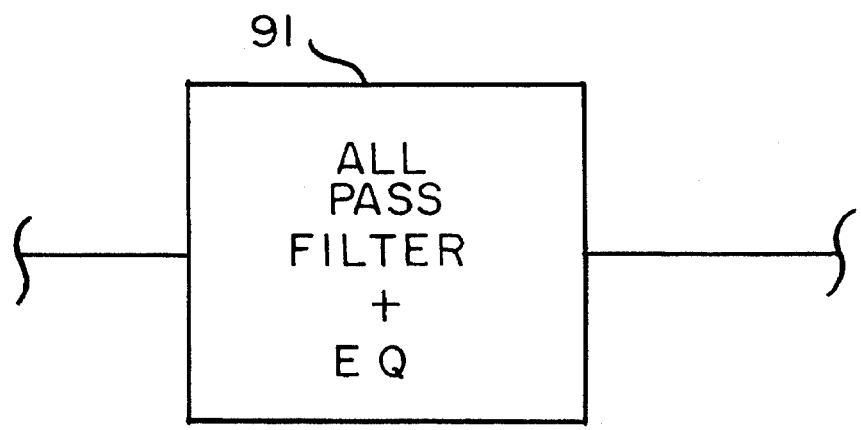
FIG. 4A is a variation of the invention employing a more selective equalization circuit.

A more costly implementation capable of more than 6 dB of equalization is illustrated in FIG. 4A. In this approach, a much broader range of equalization is available. In the arrangement, an all pass filter with equalization 91 has an input which provides a frequency dependent phase shift, as illustrated. By shifting the phase of the input signal to the augmentation amplifier gradually from zero to 180°, the output across the speaker 54 gradually changes from full to zero. As the phase shifts, the opposed signal condition across the speaker load 54 changes from opposite polarity to a like polarity condition, which results in little or no output from the speaker load 54. The phase shift technique may be used to achieve broader equalization control to allow greater flexibility in response shaping.

Figure 5:
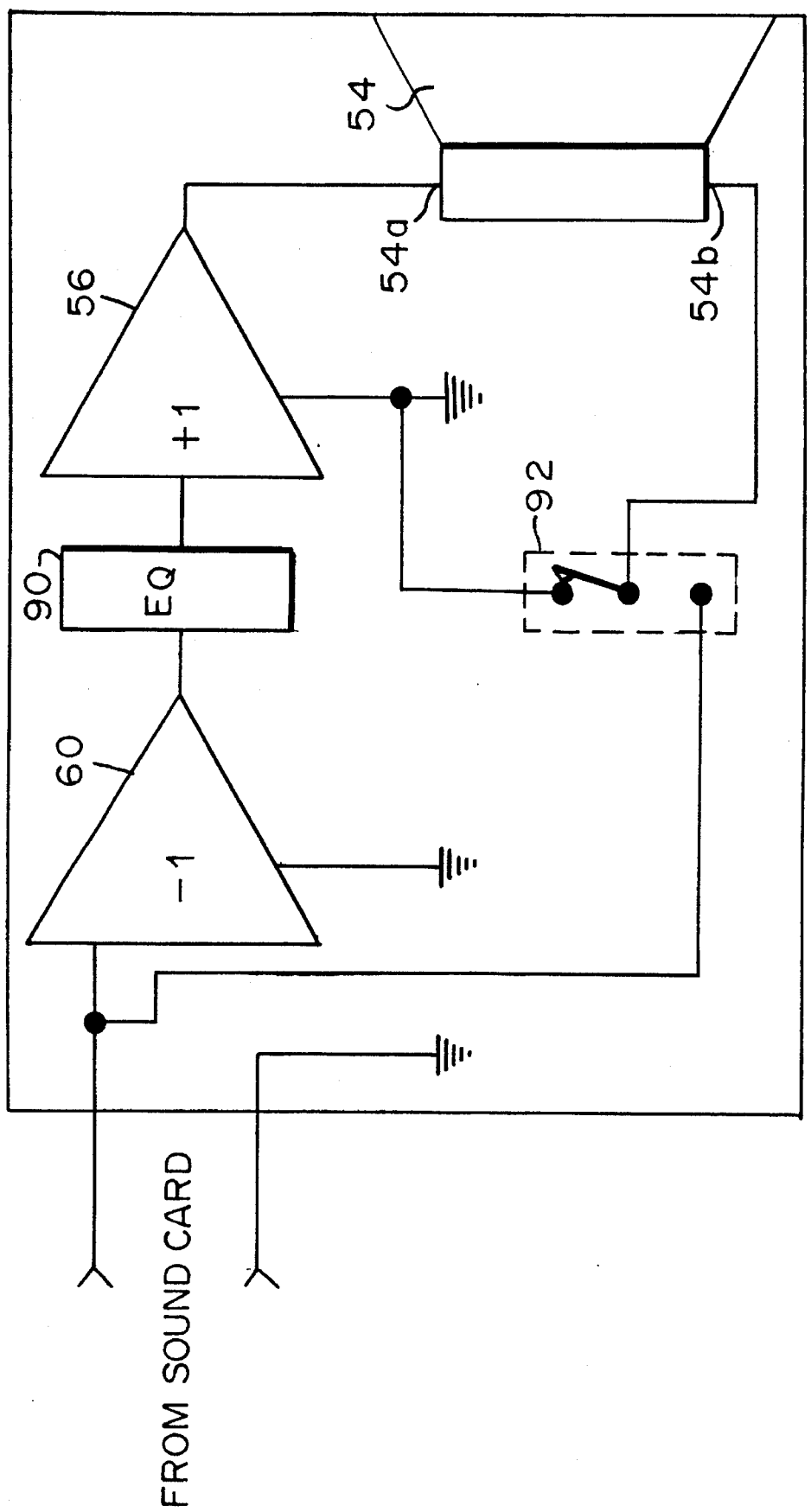
FIG. 5 is a schematic diagram of an augmentation amplifier similar to the arrangement of FIG. 4 employing an unbridging circuit.

If for some reason, the augmentation principle of the invention is not appropriate, for example, if the sound card supplied does not have a source amplifier or if the system simply does not sound pleasing, the invention may be converted or unbridged to normal amplifier operation by simply operating a switch 92 (FIG. 5). In the position shown, the switch 92 unbridges the speaker load 54 by disconnecting one side 54b of the speaker 54 from the source amplifier 22 (FIG. 2) and grounding it, as illustrated. Thus, the circuit operates in a conventional fashion. The inefficiency associated with such an arrangement is not critical because the cost of implementing the invention is on the order of 10% or less of the cost of a normal amplifier circuit. To raise the power from 4 to 8 watts by conventional means would cost at least from 60 to about 100 percent of the amplifier circuit.

The arrangement of FIG. 5 is also applicable for car stereo receivers which are not already bridged, for example, add-on power amplifiers or powered speaker modules. Likewise, if employed with a bridged system, the switch 92 can be used to disable the bridging network in the system 50 so that the speaker 54 may operate in a normal manner.

Figure 6A:
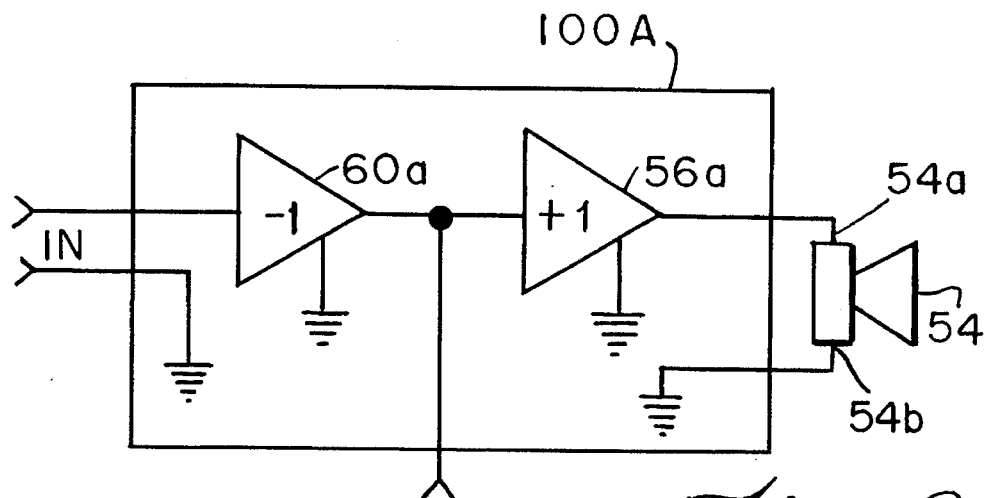
FIG. 6A is an illustration of a modular amplifier which may be employed in the present invention.
Figure 6B:
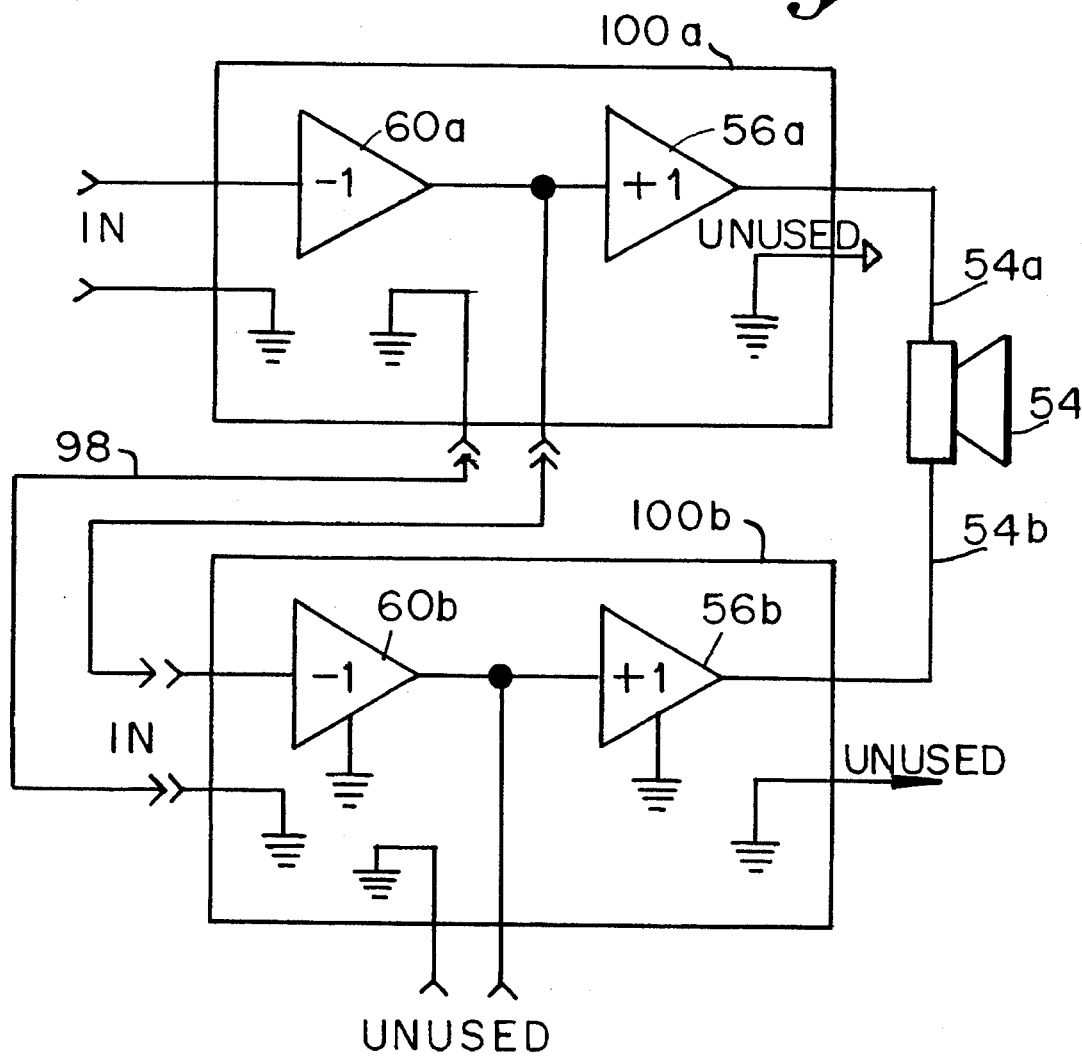
FIG. 6B is an illustration of a plurality of modular amplifiers coupled together in bridged mode for increasing the available power to a load.

The invention is also applicable for modular public address and stereo systems, but care must be taken to avoid a mismatch between the source amplifier and the system amplifier. FIG. 6A illustrates a single module 100A driving speaker 54. The module 100A employs inverting power amplifier 56A and inverter 60A. In FIG. 6B, module 100A is bridged with module 100B. It is useful to employ an automatic bridging interface 98, such as illustrated in FIG. 6B to assure that the circuits are not mismatched or misconnected.

In FIG. 6A, module 100A operates at a selected power level with a speaker 54 connected as in a typical arrangement across the speaker terminals 54a–54b. If at a later time additional power is required, module 100B may be employed to boost the available power. The modules 100A and 100B may be connected with a modular bridging interface 98 in the form of a cable arrangement which automatically bridges the amplifiers. The speaker terminal 54b is connected to the hot output 104 of the second module 100B to facilitate bridged operation.

In the modular augmentation amplifier arrangement of FIG. 6B, only one channel or amplifier module need be purchased at any given time. At some later time, upon the purchase of a second amplifier, the two can be safely and easily bridged together by the modular bridging interface connector 98. The inverting unity gain amplifier 60A facilitates the arrangement by allowing identical amplifier modules 100A and 100B to be produced and connecting them together using the modular bridging interface 98 which taps in after the inverting unity gain amplifier 60A in module 100A and is coupled to the input of the amplifier 60B in module 100B. The interface 98 may be a keyed system which only allows certain power amplifiers to be coupled together or the interface 98 may include a logic network which will only operate if the amplifier modules 100A and 100B are the same power rating.

While there have been described what are at present considered to be the preferred embodiments of the present invention, it will be apparent to those skilled in the art that various changes and modifications may be made therein without departing from the invention, and it is intended in the appended claims to cover such changes and modifications as fall within the spirit and scope of the invention.

What is claimed is:

1. A power amplifier adapted to be driven in bridge mode by the output of a separate source amplifier of a selected power capability for driving into first and second sides of a matched two sided load at maximum allowable power transfer comprising:

a unity gain first amplifier stage of a selected first polarity with a power capability matched to the source amplifier having an input and an output, said output adapted to be coupled the first side of the load; and a unity gain second amplifier stage of a polarity opposite the first amplifier stage and having an input and an output, said input of the second amplifier stage adapted to be commonly coupled both to the source amplifier and directly to the second side of the load so that the input feeds said second side of the load, said output of the second amplifier stage being serially coupled to the input of the first amplifier stage so that the first and second amplifier stages feed the first side of the load, and said power amplifier capable of delivering twice the power of the source amplifier when the load is twice the corresponding impedance at maximum allowable power transfer.

2. The power amplifier of claim 1 wherein the first amplifier stage is a unity gain power amplifier.

3. The power amplifier of claim 1 wherein the first and second amplifier stages are mounted in a chassis separate from the source amplifier.

4. The power amplifier of claim 1 wherein the load is a loud speaker.

5. The power amplifier of claim 1 further including an equalization network coupled between the first and second amplifier stages.

6. The power amplifier of claim 5 wherein the equalization network further comprises an all pass filter which provides a frequency selective phase shift to the network.

7. The power amplifier of claim 1 further comprising switching means for uncoupling the second side of the load from the input of the second amplifier stage and for connecting the second side of the load to an unbridged ground reference.

8. The power amplifier of claim 1 wherein the source amplifier is ground referenced and the first amplifier stage is referenced to ground.

9. The power amplifier of claim 1 wherein the polarity of the second amplifier stage is negative.

10. The power amplifier of claim 9 wherein the second amplifier stage has a negative polarity relative to the first amplifier stage.

11. The power amplifier of claim 1 wherein the second amplifier stage comprises an inverter.

12. A powered speaker system comprising:

an amplifier having an input and an output; and a speaker having first and second input, said speaker having a load impedance matched with the amplifier for facilitating maximum allowable power transfer therebetween;

said amplifier comprising a first power amplifier having an input and an output and a first polarity, said output of the first amplifier coupled to the first input of the speaker and a second amplifier of unity gain having an input and an output and a second polarity opposite the polarity of the first amplifier, the output of the second amplifier being coupled to the input of the first amplifier so that the first power amplifier and second amplifier feed the first input of the load in series, and the input of the second amplifier being coupled commonly directly to the amplifier input and the second input of the speaker.

13. The power amplifier of claim 12 wherein the first amplifier is a unity gain amplifier.

14. A power amplifier module adapted to be driven in bridged mode by the output signal of a separate source amplifier of a selected power capability for driving into first and second sides of a matched two-sided load at maximum allowable power transfer comprising:

a first amplifier stage with a power capability matched to the source amplifier having an input and an output, said output adapted to be coupled to the first side of the two-sided load;

an inverting second amplifier stage having an input and an output, and adapted to be directly coupled at its input to the source amplifier and to the second side of the load, said output of the second amplifier adapted to be coupled serially to the input of the first amplifier stage so that the first amplifier stage and second amplifier stage are serially connected to the first side of the load, said power amplifier system capable of delivering at least twice the power of the source amplifier when coupled to the matched load.

15. The power amplifier module of claim 14 wherein the matched load comprises a separately housed loud speaker.

16. The power amplifier module of claim 14 further comprising a bridging interface including connector means adapted to be coupled between the output of the inverting amplifier of one module and the input to the inverting amplifier of another module.

17. A powered speaker system adapted to be coupled to a separately housed source amplifier of a selected power capability relative to a load comprising:

an amplifier having an input and an output; and a speaker having a two-sided input comprising first and second terminals, said speaker having a load impedance matched with the amplifier for facilitating maximum allowable power transfer therebetween corresponding to the source amplifier;

said amplifier comprising a first unity gain power amplifier stage having an input and an output, said output of the first amplifier stage coupled to the first terminal of the speaker and a second amplifier stage being coupled to the input of the first amplifier stage so that the first and second amplifier stages are serially coupled to the first terminal of the load and the input of the second amplifier being coupled commonly to the amplifier input and directly to the second terminal of the speaker.

18. The power amplifier of claim 17 further including means for unbridging the second amplifier stage.

19. The power amplifier of claim 17 wherein the source amplifier is located on a sound card of a computer having a selected current capability and is generally inaccessible during use except for connection to its output and the powered speaker has a current capacity.

20. A power amplifier adapted to augment the power of a signal produced by a separate source comprising:

a pair of first and second input terminals and a pair of first and second output terminals;

an inverter having an input and an output, the input of the inverter being coupled to the first input terminal; and an amplifier stage having an input and an output, the output of the amplifier stage being connected to the first output terminal, and the input of the amplifier stage being serially connected to the output of the inverter so that the inverter and amplifier stage serially feed said first output terminal, a bridging lead directly connected between the input of the inverter and the second output terminal, the second input terminal being referenced at ground.

* * * * *